(12) United States Patent
Hasegawa et al.

(10) Patent No.: US 12,122,577 B2
(45) Date of Patent: Oct. 22, 2024

(54) SUBSTRATE STORAGE CONTAINER

(71) Applicant: Shin-Etsu Polymer Co., Ltd., Tokyo (JP)

(72) Inventors: Akihiro Hasegawa, Niigata (JP); Masaru Hagano, Saitama (JP); Sayo Tajika, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 23 days.

(21) Appl. No.: 18/168,541

(22) Filed: Feb. 13, 2023

(65) Prior Publication Data
US 2023/0182977 A1 Jun. 15, 2023

Related U.S. Application Data

(63) Continuation of application No. PCT/JP2021/027048, filed on Jul. 19, 2021.

(30) Foreign Application Priority Data

Nov. 10, 2020 (JP) ................................ 2020-187505

(51) Int. Cl.
*B65D 53/02* (2006.01)
*B65D 43/02* (2006.01)

(52) U.S. Cl.
CPC ........... *B65D 53/02* (2013.01); *B65D 43/022* (2013.01); *B65D 2543/00564* (2013.01); *B65D 2543/00972* (2013.01)

(58) Field of Classification Search
CPC .................. B65D 43/022; B65D 53/02; B65D 2543/00972; B65D 2543/00564
(Continued)

(56) References Cited

U.S. PATENT DOCUMENTS 6,105,782 A 8/2000 Fujimori et al.
6,457,598 B1 * 10/2002 Hsieh ................ H01L 21/67373
220/323
(Continued)

FOREIGN PATENT DOCUMENTS

JP 2000058633 2/2000
JP 2001298077 10/2001
(Continued)

OTHER PUBLICATIONS

"Written Opinion of the International Searching Authority (Form PCT/ISA/237) of PCT/JP2021/027048", mailed on Sep. 28, 2021, with English translation thereof, pp. 1-8.

*Primary Examiner* — Rafael A Ortiz
(74) *Attorney, Agent, or Firm* — JCIP GLOBAL INC.

(57) ABSTRACT

According to one embodiment, a substrate storage container comprises: a container body configured to store a substrate; a lid that closes a rectangular opening of the container body; and an annular gasket located between the container body and the lid. The container body has at least either one of a guide rib or a guide slit in an opening portion around the opening. The lid has at least either one of a guide slit or a guide rib that is engageable with the guide rib or the guide slit of the container body. The guide rib and the guide slit engage each other when the opening is closed with the lid and prevent the lid from tilting at a predetermined tilt angle or more with respect to an opening surface where the opening is formed.

4 Claims, 15 Drawing Sheets

(58) Field of Classification Search
USPC ........ 206/710, 726, 718, 711, 701, 706–709, 206/722, 723
See application file for complete search history.

(56) References Cited

U.S. PATENT DOCUMENTS

| | | | | |
|---|---|---|---|---|
| 7,073,999 | B2* | 7/2006 | Oyama | ............. H01L 21/67369 414/217 |
| 7,316,315 | B2* | 1/2008 | Matsutori | ......... H01L 21/67379 211/41.18 |
| 2003/0141217 | A1* | 7/2003 | Park | ................. H01L 21/67772 206/711 |
| 2005/0077204 | A1 | 4/2005 | Sumi et al. | |
| 2010/0276324 | A1 | 11/2010 | Hyobu | |
| 2011/0100870 | A1 | 5/2011 | Ohnuki et al. | |

FOREIGN PATENT DOCUMENTS

| | | |
|---|---|---|
| JP | 2004146676 | 5/2004 |
| JP | 2004207260 | 7/2004 |
| JP | 2007220823 | 8/2007 |
| WO | 2009157321 | 12/2009 |

* cited by examiner

SUBSTRATE STORAGE CONTAINER

CROSS-REFERENCE TO RELATED APPLICATION

This application is a Continuation of PCT International Application No. PCT/JP2021/027048, filed on Jul. 19, 2021, which claims the benefit of priority under 35 U.S.C § 119(a) from Japanese Patent Application No. 2020-187505, filed on Nov. 10, 2020; the entire contents of which are incorporated herein by reference.

FIELD

Embodiments described herein relate generally to a substrate storage container for storing substrates.

BACKGROUND

A substrate storage container is used to store substrates in an airtight condition and generally has a container body to store substrates, a lid to close the rectangular opening of the container body, and an annular gasket located between the container body and the lid (see Patent Document 1).

Semiconductors are manufactured in an automated facility, where a robot automatically opens and closes the lid. Meanwhile, there are still some processes that are not automated, such as the washing and drying of the substrate storage container. In these processes, an operator manually closes the lid.

When closing the lid manually, the operator may accidentally try to attach the lid upside down to the container body since the outer surface of the lid is almost vertically (top and bottom) symmetrical (or left and right symmetrical). The lid can be attached even if upside down, and the locking mechanism for fixing the lid works properly. In such a case, however, a wafer holding member (front retainer) provided on the inner surface of the lid is not placed in a regular position, which causes a problem in storing wafers later in the subsequent process.

To address the issue, for example, Patent Document 1 discloses a substrate storage container in which the container body has two recesses on the upper side of the opening and one recess on the lower side of the opening, and the lid has two protrusions on the upper side of the outer periphery and one protrusion on the lower side of the outer periphery. With this structure, the lid cannot be attached upside down, thereby preventing the lid from being erroneously attached.

Patent Document 1: Japanese Unexamined Patent Publication No. 2001-298077

However, there is yet another issue besides attaching the lid upside down as described above: when the operator manually closes the lid, they may sometimes try to attach the lid to the container body at an angle to the opening surface (the surface where the opening is formed) of the container body, instead of attaching it along the direction normal to the opening surface (see FIGS. 5 to 6F). In this case, the gasket of the lid does not come into contact with the sealing surface that is substantially parallel to the opening surface, and the container body is closed with the gasket riding on the inner wall of the container body on the far side (see FIGS. 6E and 6F). As a result, the gasket may be broken or damaged, or the airtightness of the substrate storage container could be compromised due to poor sealing of the gasket.

Therefore the present disclosure, at least to some extent, overcomes the above disadvantages and provides a substrate storage container capable of preventing a seal failure attributable to a gasket, which may occur when the opening of the container body is closed with a lid.

DETAILED DESCRIPTION

Figure 1:
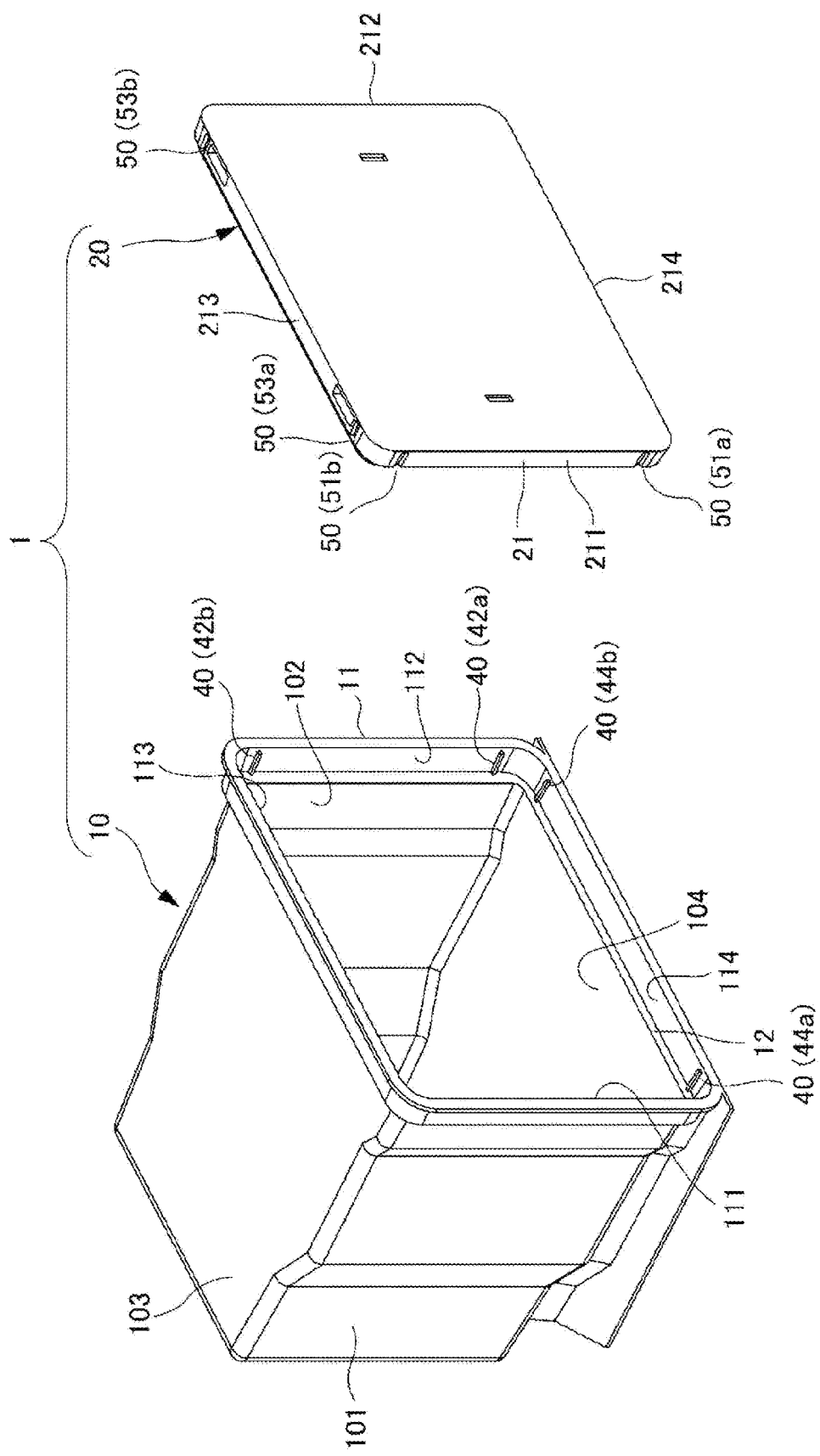
FIG. 1 is a schematic exploded perspective view of a substrate storage container according to an embodiment.

In general, according to one embodiment, a substrate storage container comprises: a container body configured to store a substrate; a lid that closes a rectangular opening of the container body; and an annular gasket located between the container body and the lid. The container body has at least either one of a guide rib or a guide slit in an opening portion around the opening. The lid has at least either one of a guide slit or a guide rib that is engageable with the guide rib or the guide slit of the container body. The guide rib and the guide slit engage each other when the opening is closed with the lid and prevent the lid from tilting at a predetermined tilt angle or more with respect to an opening surface where the opening is formed.

In some embodiments, the guide rib and the guide slit engage each other when the opening is closed with the lid and prevent the lid from tilting 20 degrees or more with respect to the opening surface. In other embodiments, in a case where the lid is tilted with respect to the opening surface when the opening is closed with the lid, the guide rib and the guide slit engage each other for any tilt angle from 0 degrees to less than 20 degrees, and the guide rib and the guide slit do not engage each other for a tilt angle of 20 degrees or more.

In the following, exemplary embodiments will be described in greater detail with reference to the accompanying drawings. Note that like parts are designated by like reference numerals or characters throughout the description of the embodiments.

Figure 2:
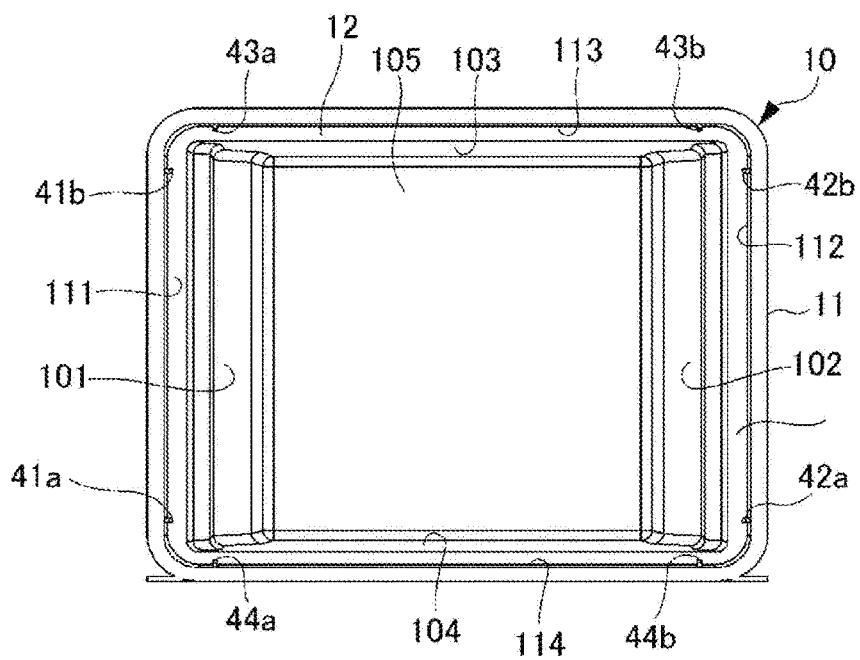
FIG. 2 is a front view of a container body of the substrate storage container, viewed from the opening side.
Figure 3:
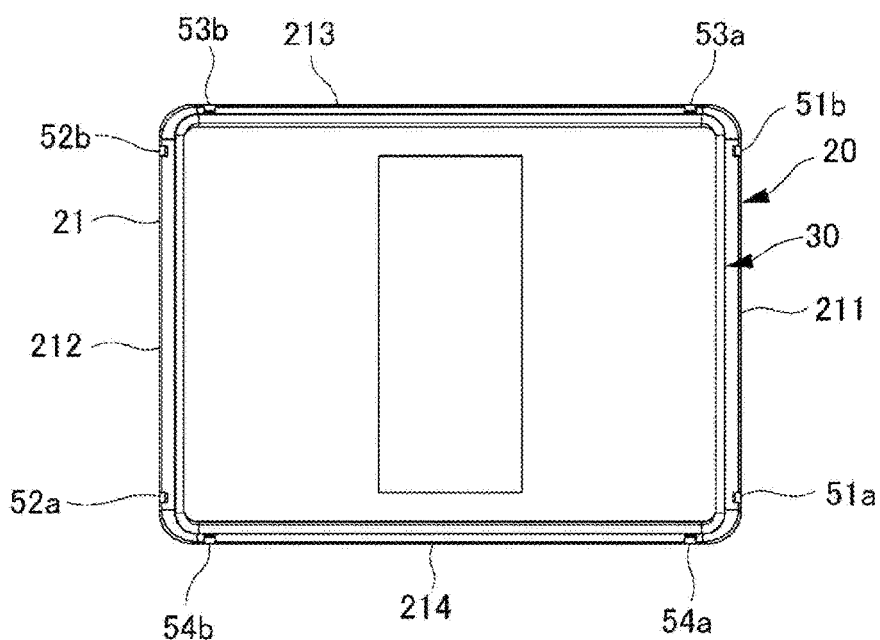
FIG. 3 is a rear view of a lid of the substrate storage container, viewed from the container body side.

FIG. 1 is a schematic exploded perspective view of a substrate storage container 1 according to an embodiment. FIG. 2 is a front view of a container body 10 of the substrate storage container 1, viewed from the opening side. FIG. 3 is a rear view of a lid 20 of the substrate storage container 1, viewed from the container body 10 side.

As illustrated in FIG. 1, the substrate storage container 1 includes the container body 10 configured to store substrates, the lid 20 that closes the rectangular opening of the container body 10, and an annular gasket 30 (see FIG. 3) that is located between the container body 10 and the lid 20. The substrate storage container 1 is formed in a size capable of storing substrates such as wafers with a diameter of 300 mm or 450 mm.

With reference to FIGS. 1 and 2, the container body 10 includes a left wall 101, a right wall 102, a top wall 103, a bottom wall 104, and a rear wall 105. In other words, the container body 10 has a shape of a front open box with an opening in the front. Around the opening is an opening portion 11 that is formed in a bent (stepped) shape that spreads outward with steps. A step of the opening portion 11 formed on the front side has a surface that serves as a sealing surface 12 to be in contact with the gasket 30. The inner surfaces extending behind the sealing surface 12 toward the rear wall 105 correspond to the left wall 101, the right wall 102, the top wall 103, and the bottom wall 104.

The container body 10 is provided with a support (not illustrated) on the inner surfaces of the left wall 101 and the right wall 102. The support has the function of placing and positioning substrates. The support includes a plurality of grooves formed in the height direction, which constitute a serrated surface. Each substrate is placed with the support of a pair of left and right grooves at the same height. The support may be made of the same material as that of the container body 10, or it may be made of a different material to enhance washability and sliding properties.

The container body 10 is also provided with a rear retainer (not illustrated) on the inner surface of the rear wall 105. The rear retainer is paired with a front retainer (described later) to retain or hold substrates when the container body 10 is closed with the lid 20. However, the container body 10 need not necessarily have such a rear retainer as in the embodiment. Instead, the support may have a substrate holding portion in, for example, a "<" shape or straight shape on the far side of the serrated surface to hold substrates with the front retainer and the substrate holding portion. The support and the rear retainer are provided to the container body 10 by insert molding, fitting, or the like.

Substrates are stored in the interior space of the container body 10 while being supported by the support. An example of substrates may be silicon wafers but is not so limited. For example, substrates may be quartz wafers, gallium arsenide wafers, or the like.

The container body 10 also has a manual handle (not illustrated) to be held by an operator, which is removably attached to the outer surface of each of the left wall 101 and the right wall 102.

The container body 10 further has a robotic flange (not illustrated), which is detachably provided on the top wall 103. In a factory, a transport robot grips the robot flange to transport the substrate storage container 1 to each processing equipment that performs a process for processing substrates.

At least one of the container body 10 and the lid 20 has a removable filter for filtering gas. In addition, the container body 10 is provided with, for example, an intake valve and an exhaust valve (not illustrated) that function as a check valve in the bottom wall 104. An inert gas such as nitrogen gas or dry air is supplied from the intake valve to the inside of the substrate storage container 1, which is closed by the lid 20, and is discharged from the exhaust valve as necessary to replace the gas inside the substrate storage container 1 or to keep the inside airtight. Although the intake valve and the exhaust valve are preferably located outside a position where substrates are projected onto the bottom wall 104, the number and location of the valves are not particularly limited. Incidentally, the intake valve and the exhaust valve have a filter for filtering gas.

As illustrated in FIGS. 1 and 3, the lid 20 has a substantially rectangular shape and is attached to the substantially rectangular opening of the container body 10. The lid 20 is formed of a cover on the front side and a main body on the side facing the opening of the container body 10. The lid 20 is provided with a locking mechanism (not illustrated) that can be retracted from an upper side 213 and a lower side 214 of an outer periphery 21 or extended to the outside. The locking mechanism has an engagement claw which is fitted into an engagement hole (not illustrated) formed in the container body 10 to thereby lock the lid 20.

The lid 20 has an elastic front retainer (not illustrated), which is removably attached to or integrally formed in the central portion (the portion surrounded by a solid rectangle in FIG. 3), for horizontally holding the front periphery of substrates. The front retainer is a part that comes into direct contact with wafers as with the serrated surface and the substrate holding portion of the support, and therefore it is made of a material with good washability and sliding properties.

The lid 20 also has an attachment groove (not illustrated) to which the gasket 30 is attached. The attachment groove is formed, for example, annularly in a substantially U shape in a cross-sectional view in the outer periphery 21 of the lid 20 or the surface on the container body 10 side.

Examples of materials for the container body 10 and the lid 20 include thermoplastic resins such as polycarbonate, cycloolefin polymer, polyetherimide, polyethersulfone, polyetheretherketone, and liquid crystal polymer. A conductive agent made of conductive carbon, conductive fibers, metal fibers, conductive polymers, or the like, various antistatic agents, ultraviolet absorbers, and the like may be added to the thermoplastic resins as appropriate.

The gasket 30 is located between the sealing surface 12 of the container body 10 and the lid 20. When the lid 20 is attached to the container body 10, the gasket 30 adheres closely to the sealing surface 12. The gasket 30 thereby ensures the airtightness of the substrate storage container 1 while preventing dust, moisture, and the like from entering the substrate storage container 1 from the outside as well as reducing gas leakage from the inside to the outside.

As illustrated in FIG. 3, the gasket 30 has an annular shape corresponding to the front shape of the lid 20 (and the shape of the opening portion 11 of the container body 10), and in this embodiment, it has a rectangular frame shape. However, the annular gasket 30 may be in a circular ring shape before being attached to the lid 20.

Figure 4A:
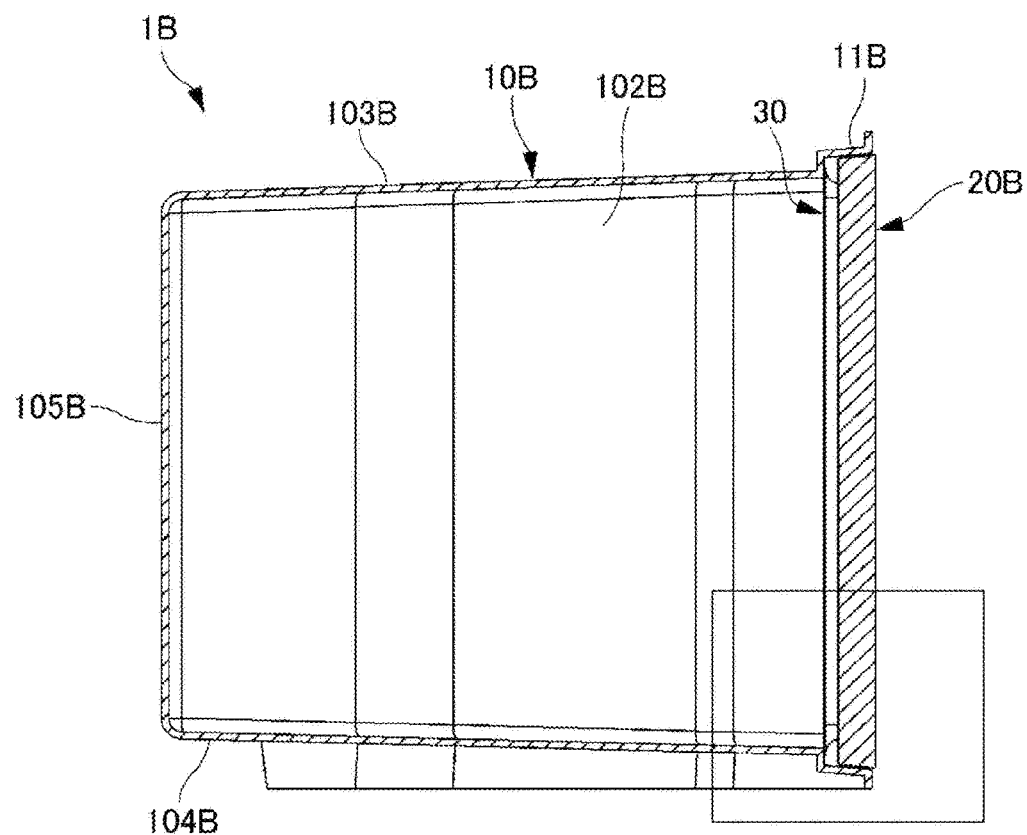
FIG. 4A is a schematic cross-sectional view illustrating the substrate storage container in a normal sealed state.
Figure 4B:
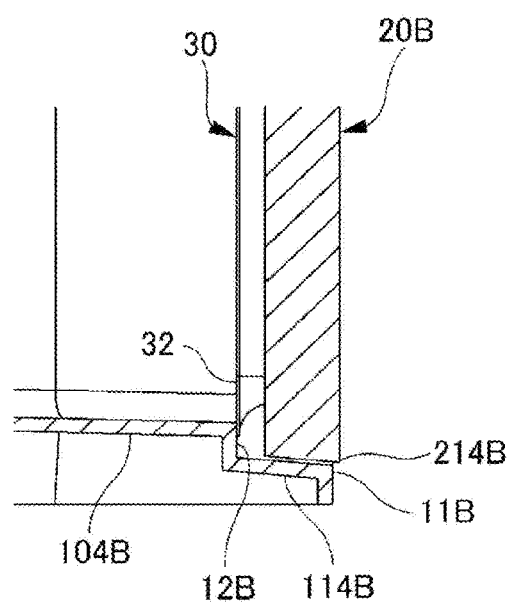
FIG. 4B is a partially enlarged cross-sectional view of FIG. 4A.

The gasket 30 is formed of a main body that is fitted in the attachment groove and a sealing piece 32 that extends from the main body (see FIG. 4B). The main body is formed in an annular shape similar to the shape of the attachment groove of the lid 20, and its cross-section is substantially rectangular so as to correspond to the cross-sectional shape of the attachment groove. The main body has a flat surface so that the gasket 30 can be pushed into the bottom side of the attachment groove.

On the other hand, the sealing piece 32 is formed in a substantially J-shape from the main body toward the sealing surface 12 side in a cross-sectional view so as to come into contact with the sealing surface 12.

Examples of materials for the gasket 30 include thermoplastic elastomers such as polyester-based elastomers, polyolefin-based elastomers, fluoroelastomers, and urethane-based elastomers, and elastic materials such as fluorine rubbers, ethylene-propylene rubbers, and silicone rubbers. Carbon fibers, metal fibers, metal oxides, various antistatic agents, and the like may be added to the materials as appropriate to impart conductivity and antistatic properties thereto. In addition, additives that impart various functions or properties may also be added to the materials as necessary. Incidentally, the gasket 30 preferably has a hardness of Shore A 40 to 90, more preferably Shore A 60 to 90.

Described below is a sealing structure of a container body 10B and a lid 20B for ensuring airtightness in a conventional substrate storage container 1B. FIGS. 4A and 4B illustrate the substrate storage container 1B in its normal sealed state: FIG. 4A is a schematic cross-sectional view, and FIG. 4B is a partially enlarged cross-sectional view of FIG. 4A. Note that since the conventional substrate storage container 1B has a gasket similar to that of the substrate storage container 1 of the present embodiment, the letter B is not attached to the reference numeral of the gasket 30.

As illustrated in FIGS. 4A and 4B, the container body 10B includes a right wall 102B, a top wall 103B, and a rear wall 105B, and when the lid 20B is correctly and normally attached to the container body 10B by a robot, the sealing piece 32 of the gasket 30 is deformed by about 1 mm in the closing direction after coming into contact with a sealing surface 12B of an opening portion 11B to be in a crushed state. The airtightness of the substrate storage container 1B is ensured by the sealing structure in which the gasket 30 and the container body 10B are in proper contact with each other in this manner.

Meanwhile, when an operator attaches the lid 20B to the container body 10B, they do not always perform the closing operation in an accurate position and posture (angle) unlike a robot, which may result in poor sealing. Accordingly, the closing operation in which an operator attaches the lid 20B to the container body 10B will be described below.

Figure 5:
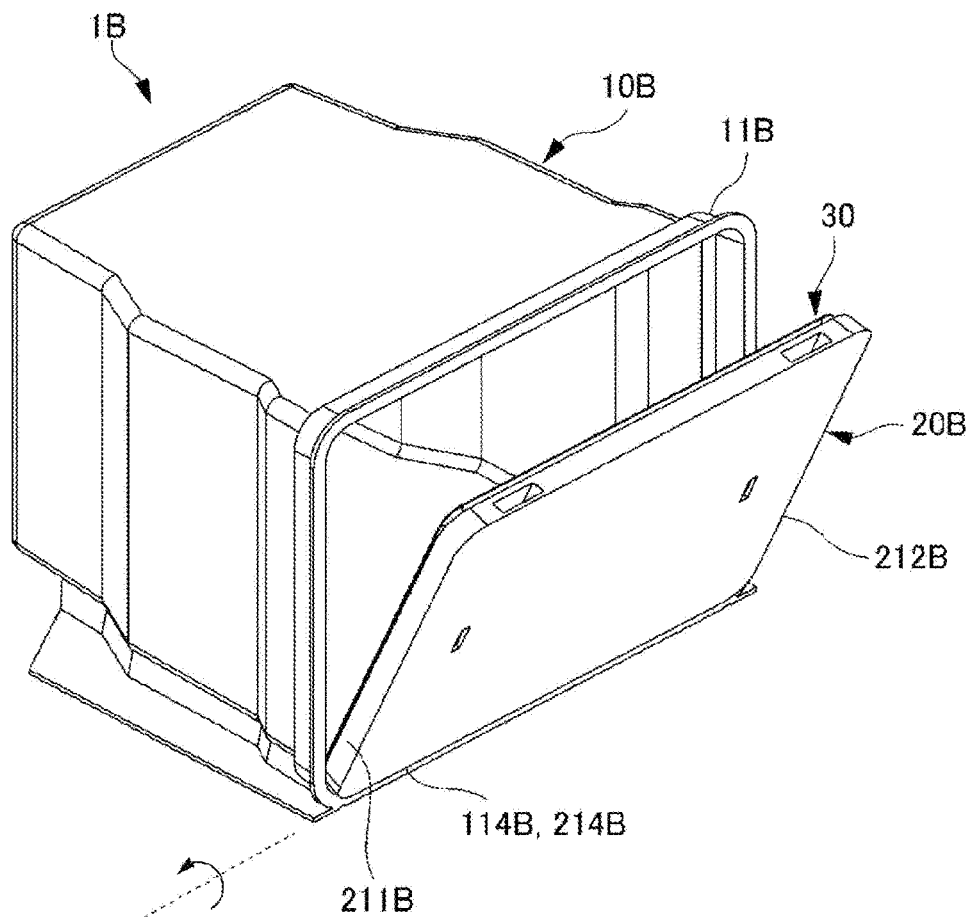
FIG. 5 is a schematic perspective view illustrating a case where the lid is attached while being tilted about the lower side of the outer periphery.
Figure 6A:
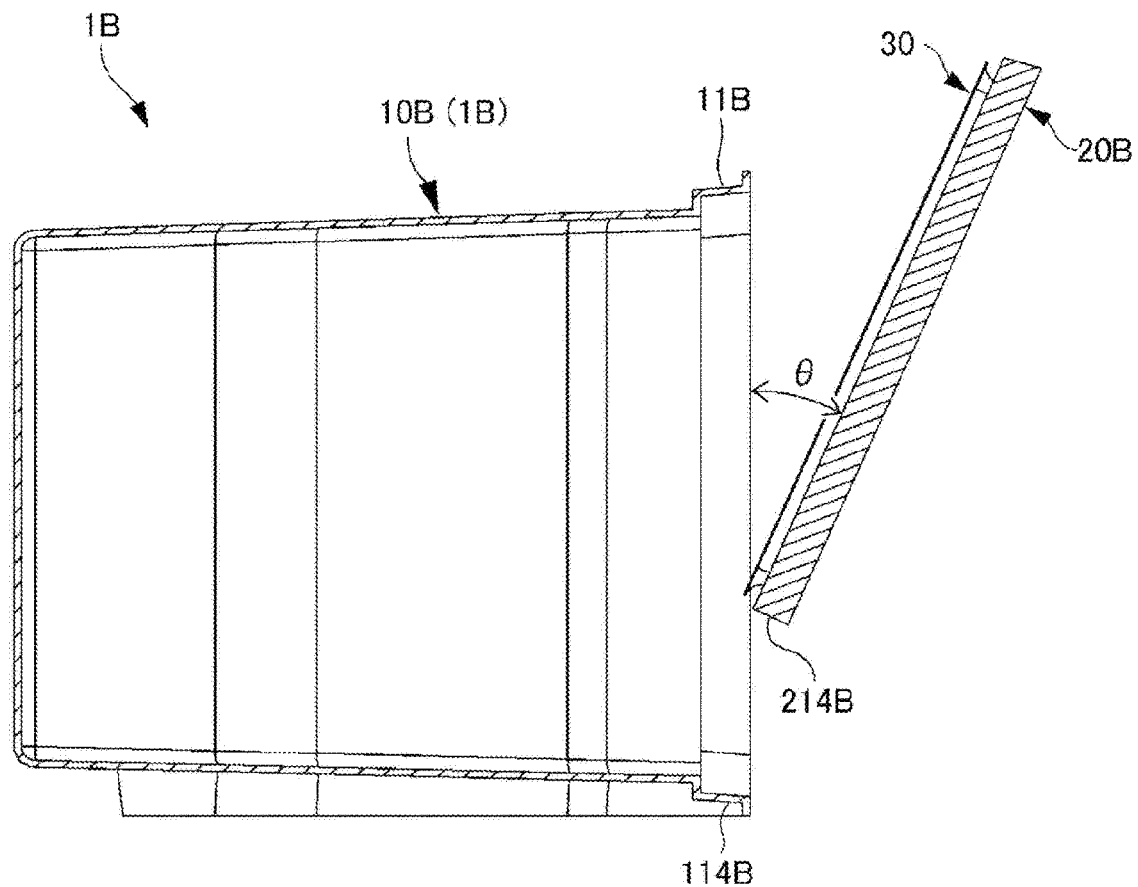
FIG. 6A is a schematic cross-sectional view illustrating process A in which a seal failure occurs.
Figure 6B:
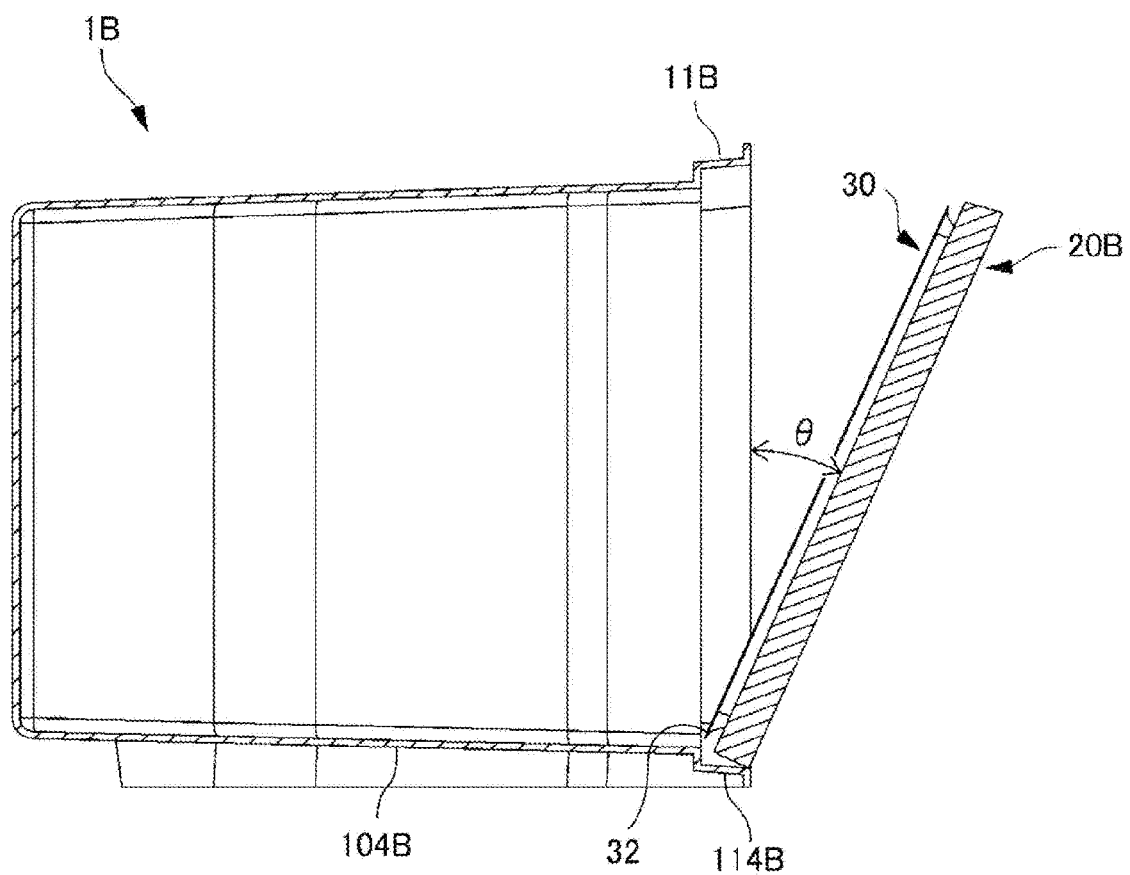
FIG. 6B is a schematic cross-sectional view illustrating process B in which a seal failure occurs.
Figure 6C:
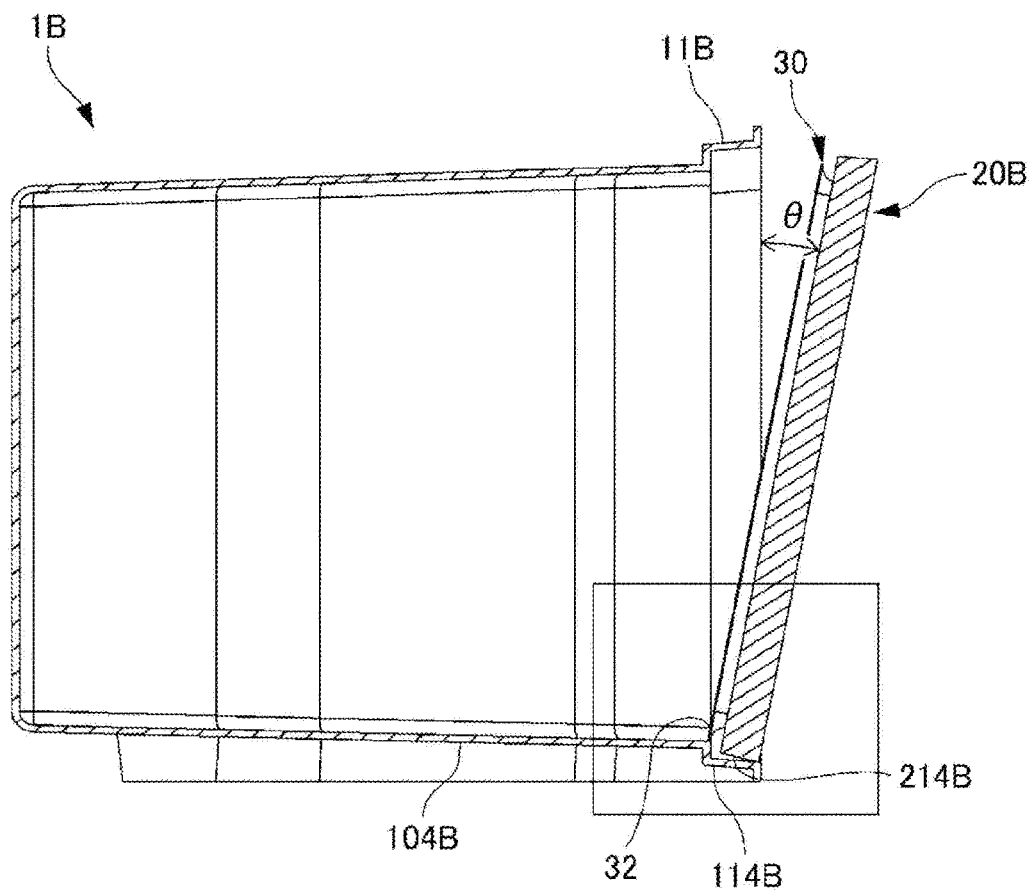
FIG. 6C is a schematic cross-sectional view illustrating process C in which a seal failure occurs.
Figure 6D:
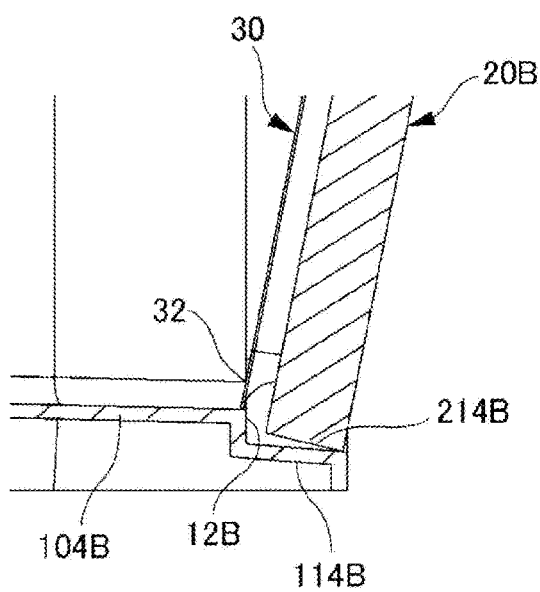
FIG. 6D is a partially enlarged cross-sectional view of FIG. 6C.
Figure 6E:
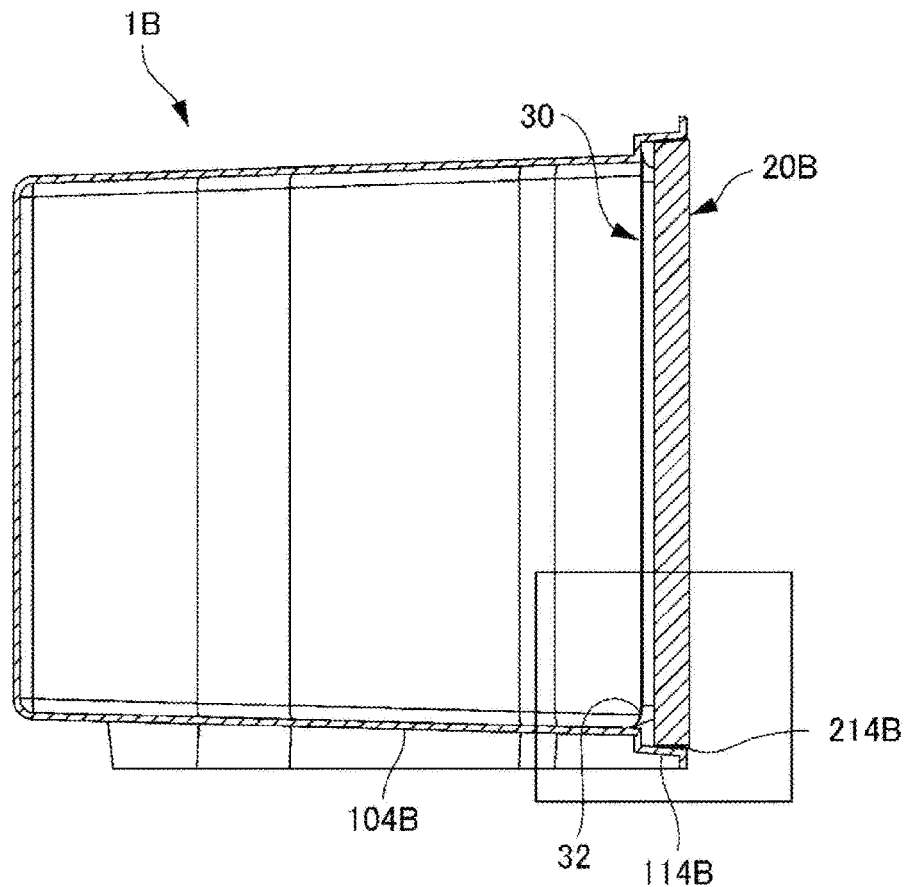
FIG. 6E is a schematic cross-sectional view illustrating process D in which a seal failure occurs.
Figure 6F:
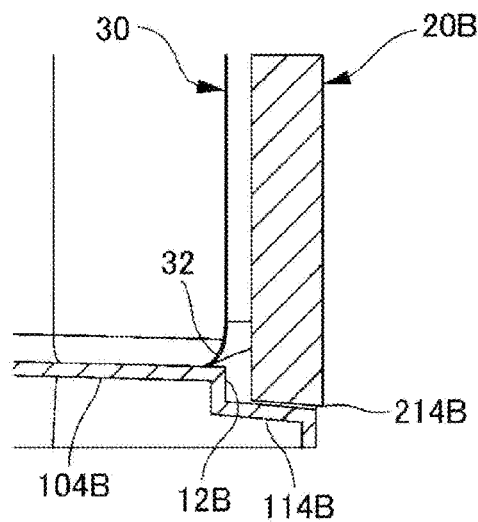
FIG. 6F is a partially enlarged cross-sectional view of FIG. 6E.

FIG. 5 is a schematic perspective view illustrating a case where the lid 20B is attached while being tilted about a lower side 114B (214B). FIGS. 6A to 6F illustrate processes in which a seal failure occurs: FIG. 6A is a schematic cross-sectional view illustrating process A, FIG. 6B is a schematic cross-sectional view illustrating process B, FIG. 6C is a schematic cross-sectional view illustrating process C, FIG. 6D is a partially enlarged cross-sectional view of FIG. 6C, FIG. 6E is a schematic cross-sectional view illustrating process D, and FIG. 6F is a partially enlarged cross-sectional view of FIG. 6E.

When an operator attaches the lid 20B to the container body 10B, first, the operator inserts unlocking jigs into left and right locking mechanisms of the lid 20B to hold the lid 20B or inserts their fingers into notch openings or recesses around the locking mechanisms to grip the lid 20B. Then, as illustrated in FIGS. 6A and 6B, the operator places the lid 20B such that the lower side 214B of the lid 20B is supported by the lower side 114B of the opening portion 11B. Thereby, the lid 20B is brought into a state as illustrated in FIG. 5.

After that, the operator moves the lid 20B toward the container body 10B so that the tilt angle θ with respect to the opening surface becomes smaller. At this time, the sealing piece 32 of the gasket 30 may sometimes ride on a bottom wall 104B (the inner surface thereof) without contacting the sealing surface 12B (see FIG. 4B) as illustrated in FIGS. 6C and 6D since its lower end (tip) is located above the bottom wall 104B as illustrated in FIG. 6B.

When the lid 20B becomes substantially parallel to the opening surface (moves to its closing position) as the operator continues to move the lid 20B toward the container body 10B, the sealing piece 32 of the gasket 30 that has ridden on the bottom wall 104B is bent backward on the bottom wall 104B without contacting the sealing surface 12B as illustrated in FIGS. 6E and 6F.

In this case, all or part of the sealing piece 32 of the gasket 30 is left riding on the bottom wall 104B, and therefore the sealing piece 32 is twisted. As a result, the normal sealed state as illustrated in FIGS. 4A and 4B is not achieved. In particular, when the internal pressure of the substrate storage container 1B is lower than the external atmosphere (pressure), a seal failure occurs, and outside air is likely to enter the inside.

In view of the above, in the substrate storage container 1 of the embodiment, the container body 10 has guide ribs 40, and the lid 20 has guide slits 50 that are engageable with the guide ribs 40. With this structure, the lid 20 cannot be attached when the tilt angle θ of the lid 20 (the rectangular main surface thereof) with respect to the opening surface (the surface where the opening is formed) of the container body 10 exceeds an allowable range.

Referring back to FIGS. 1 and 2, the container body 10 is provided with a total of eight guide ribs 41a, 41b, 42a, 42b, 43a, 43b, 44a, and 44b (herein sometimes collectively referred to as "guide ribs 40") on left, right, upper, and lower sides 111, 112, 113, and 114 of the opening portion 11.

The guide ribs 40 are formed as rod-shaped protrusions each having a predetermined width, height, and length so as to extend along the normal direction of the opening surface to slightly inside the edge of the opening portion 11.

On the other hand, as illustrated in FIG. 3, the lid 20 is provided with a total of eight guide slits 51a, 51b, 52a, 52b, 53a, 53b, 54a, and 54b (herein sometimes collectively referred to as "guide slits 50") on left, right, upper, and lower sides 211, 212, 213, and 214 of the outer periphery 21 around the area adjacent to the opening portion 11 of the container body 10. The guide slits 51a, 51b, 52a, 52b, 53a, 53b, 54a, and 54b correspond to the guide ribs 41a, 41b, 42a, 42b, 43a, 43b, 44a, and 44b of the container body 10, respectively. Note that since FIG. 3 is a rear view illustrating the lid 20 viewed from the container body 10 side, the left side 211 and the right side 212 appear reversed in FIG. 3.

The guide slits 50 are formed as groove-shaped recesses which extend along the normal direction of the opening surface such that the guide ribs 40 can be inserted therein. The guide slits 50 have a width larger than that of the guide ribs 40.

Next, the engagement relationship between the guide ribs 40 and the guide slits 50 will be described in relation to the tilt angle θ of the lid 20 with respect to the container body 10. Note that the tilt angle θ refers herein to the angle of the lid 20 with respect to the opening surface of the container body 10 in a state where one of the sides 211, 212, 213, and 214 of the lid 20 is in contact with a corresponding one of the sides 111, 112, 113, and 114 of the container body 10. In addition, assuming that the direction that connects the left wall 101 and the right wall 102 corresponds to the X axis, the direction that connects the top wall 103 and the bottom wall 104 corresponds to the Z axis, and the direction that connects the rear wall 105 and the opening surface corresponds to the Y axis, the X, Y and Z axes are perpendicular to one another, and the opening surface is parallel to the ZX plane.

Figure 7A:
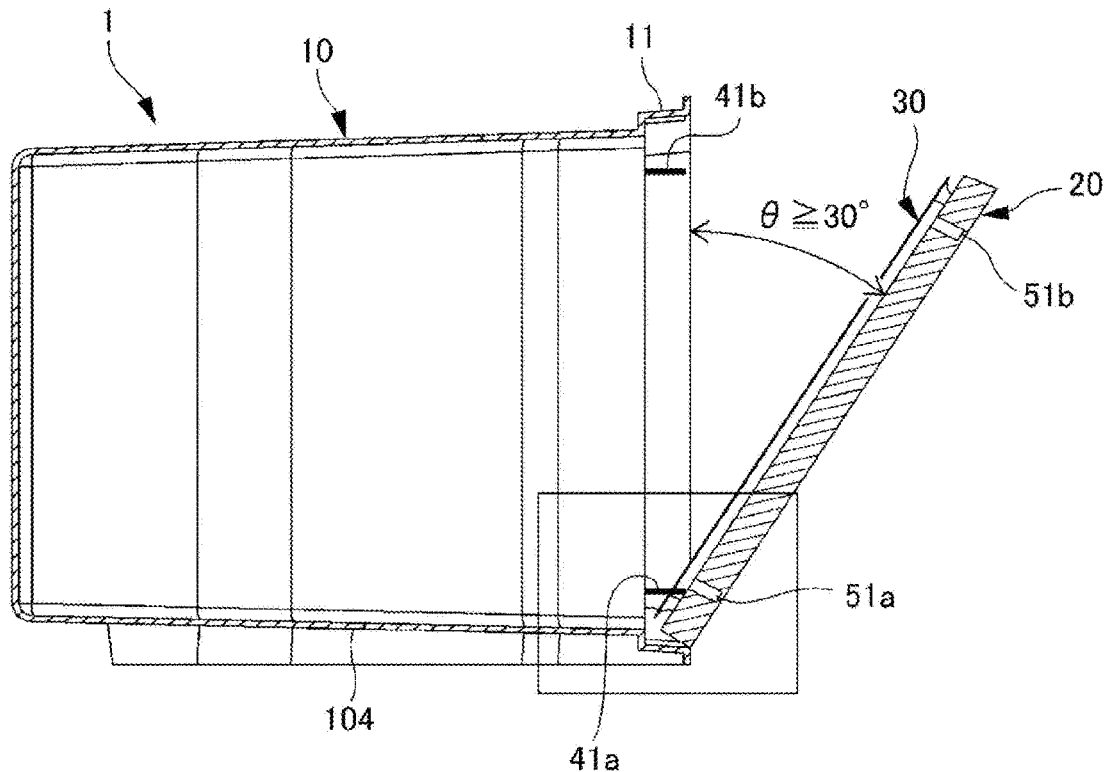
FIG. 7A is a schematic cross-sectional view illustrating the engagement between a guide rib and a guide slit when the lid is attached at an angle of 30 degrees or more.
Figure 7B:
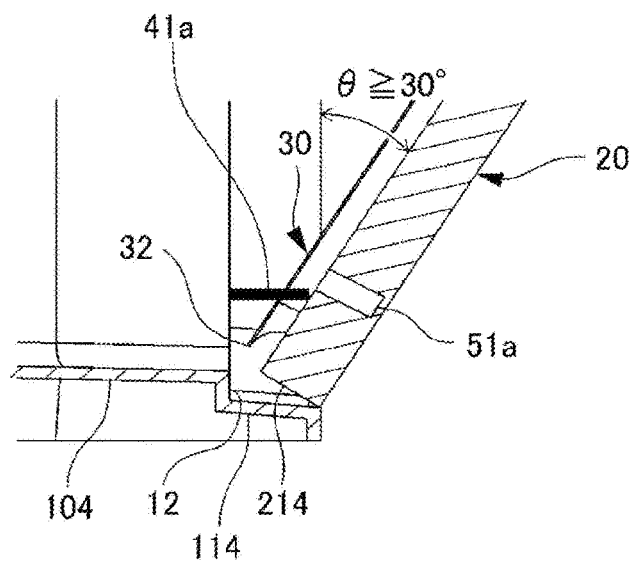
FIG. 7B is a partially enlarged cross-sectional view of FIG. 7A.
Figure 8A:
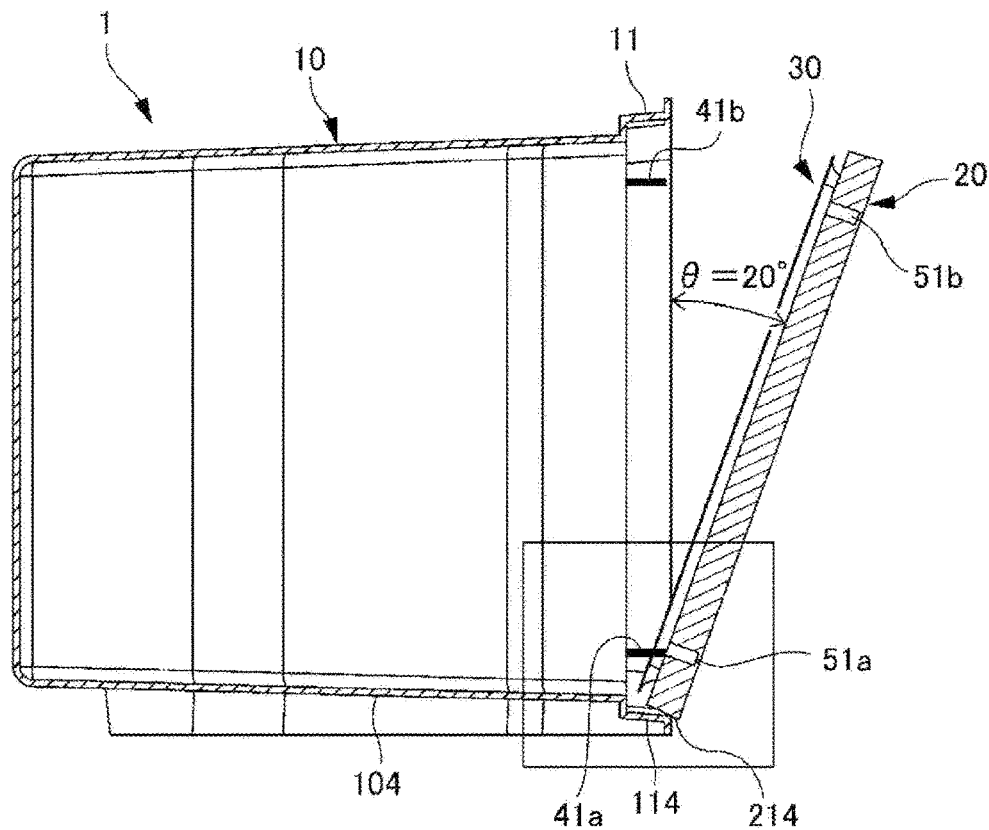
FIG. 8A is a schematic cross-sectional view illustrating the engagement between the guide rib and the guide slit when the lid is attached at an angle of 20 degrees.
Figure 8B:
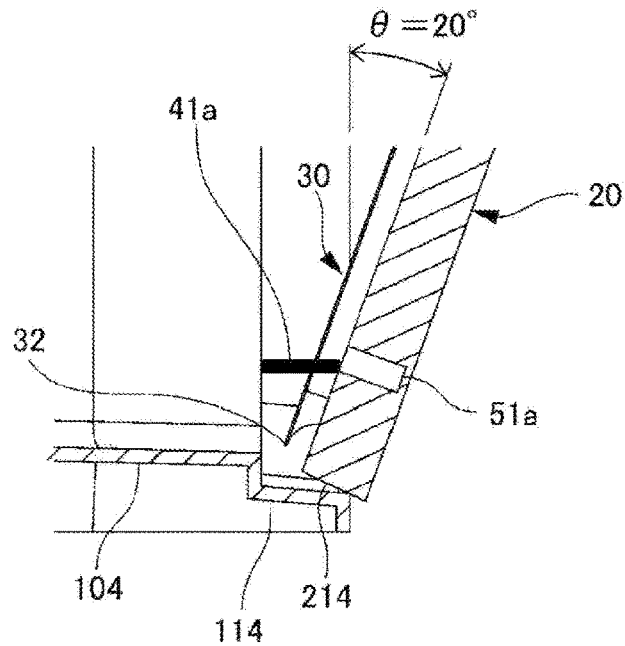
FIG. 8B is a partially enlarged cross-sectional view of FIG. 8A.
Figure 9A:
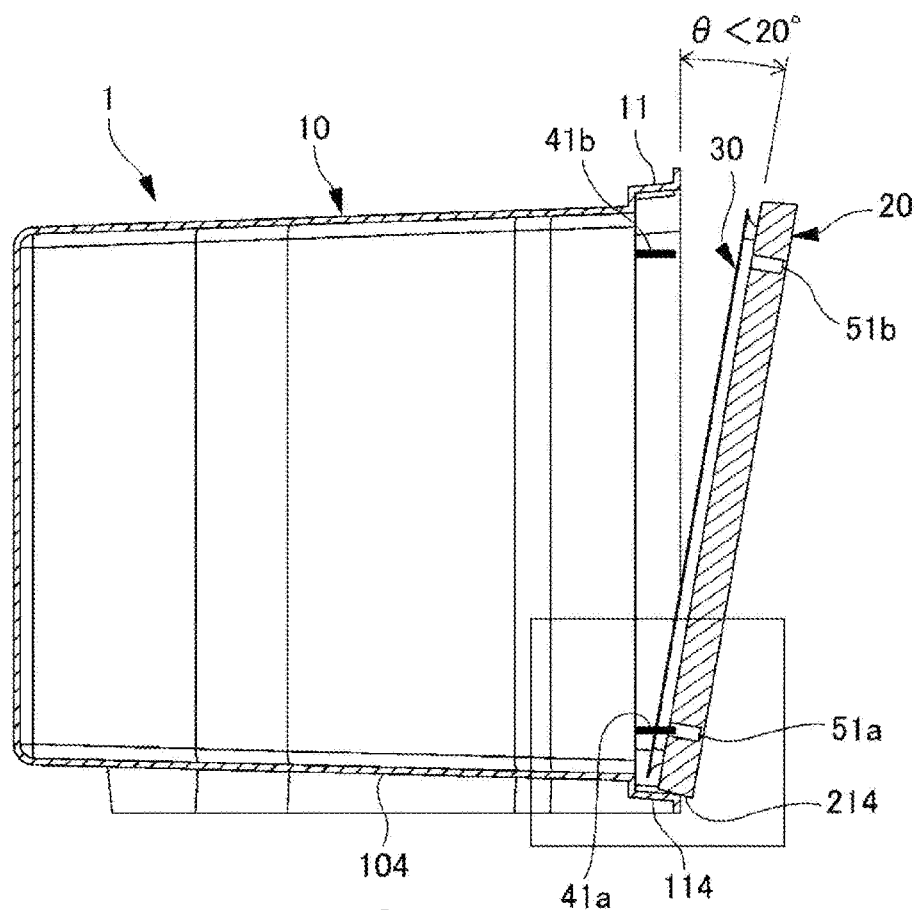
FIG. 9A is a schematic cross-sectional view illustrating the engagement between the guide rib and the guide slit when the lid is attached at an angle of less than 20 degrees.
Figure 9B:
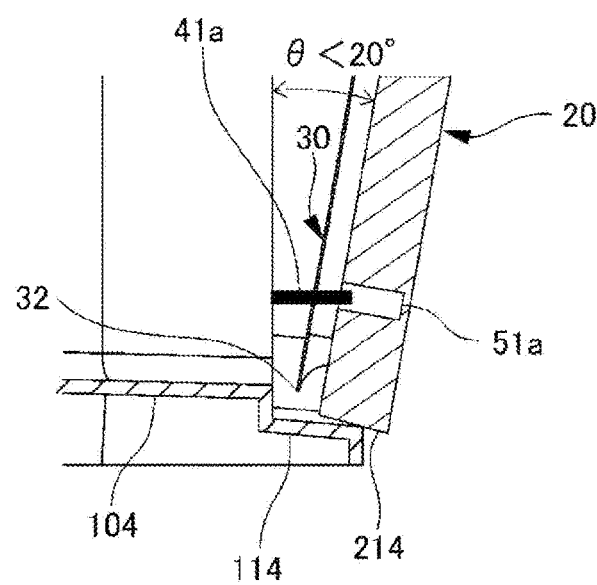
FIG. 9B is a partially enlarged cross-sectional view of FIG. 9A.
Figure 10A:
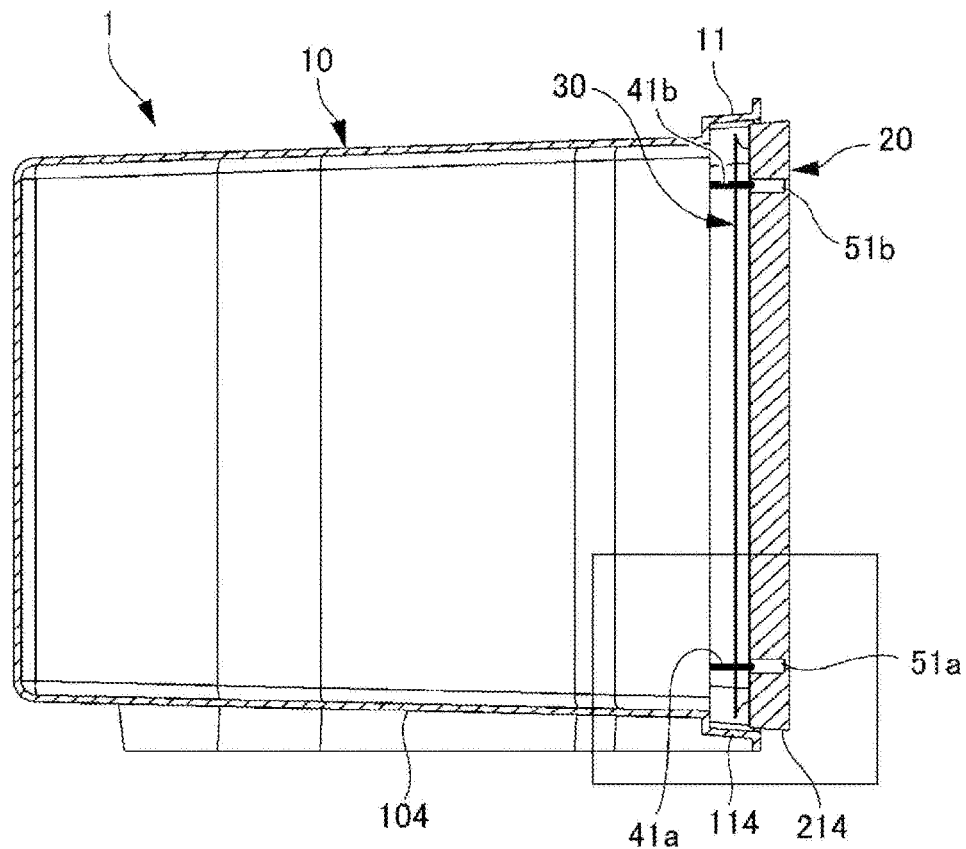
FIG. 10A is a schematic cross-sectional view illustrating the engagement between the guide rib and the guide slit when the lid is attached without being tilted.
Figure 10B:
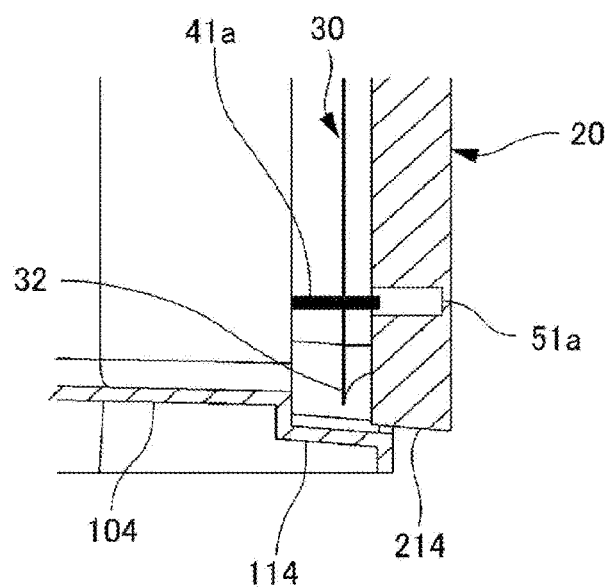
FIG. 10B is a partially enlarged cross-sectional view of FIG. 10A.

FIGS. 7A and 7B illustrate the engagement between the guide ribs 40 and the guide slits 50 when the lid 20 is attached at an angle of 30 degrees or more: FIG. 7A is a schematic cross-sectional view, and FIG. 7B is a partially enlarged cross-sectional view of FIG. 7A. FIGS. 8A and 8B illustrate the engagement between the guide ribs 40 and the guide slits 50 when the lid 20 is attached at an angle of 20 degrees: FIG. 8A is a schematic cross-sectional view, and FIG. 8B is a partially enlarged cross-sectional view of FIG. 8A. FIGS. 9A and 9B illustrate the engagement between the guide ribs 40 and the guide slits 50 when the lid 20 is attached at an angle of less than 20 degrees: FIG. 9A is a schematic cross-sectional view, and FIG. 9B is a partially enlarged cross-sectional view of FIG. 9A. FIGS. 10A and 10B illustrate the engagement between the guide ribs 40 and the guide slits 50 when the lid 20 is attached without being tilted: FIG. 10A is a schematic cross-sectional view, and FIG. 10B is a partially enlarged cross-sectional view of FIG. 10A. Note that FIGS. 7A to 10B illustrate only the left sides 111 and 211 because the substrate storage container 1 is symmetrical and the right sides 112 and 212 are similar to the left sides.

Described first is the case where the lid 20 is attached at an angle of 30 degrees or more. As illustrated in FIGS. 7A and 7B, the guide rib 41a of the container body 10 contacts (interferes with) the left side 211 of the lid 20 so that the opening of the container body 10 cannot be closed when the tilt angle θ is 30 degrees. The same applies when the tilt angle θ is more than 30 degrees.

Described next is the case where the lid 20 is attached at an angle of 20 degrees (including, for example, the case where the tilt angle is changed from 30 degrees or more to 20 degrees, and the case where the lid 20 is tilted 20 degrees from the beginning when attached). As illustrated in FIGS. 8A and 8B, the guide rib 41a of the container body 10 contacts (interferes with) the left side 211 of the lid 20 so that the opening of the container body 10 cannot be closed when the tilt angle θ is 20 degrees.

On the other hand, when the lid 20 is attached at an angle of less than 20 degrees (including, for example, the case where the tilt angle is changed from 30 degrees or more to less than 20 degrees, and the case where the lid 20 is tilted less than 20 degrees from the beginning when attached), as illustrated in FIGS. 9A and 9B, the guide rib 41a of the container body 10 can be engaged with (inserted in) the guide slit 51a of the lid 20 without contacting (interfering with) the left side 211 of the lid 20. Incidentally, the tilt angle θ is indicated with reference to a plane parallel to the opening surface in the enlarged view of FIG. 9B.

After that, by pushing the lid 20 toward the rear wall 105 of the container body 10, the guide rib 41a engages deeper into the guide slit 51a, and the tilt angle θ becomes smaller. As a result, the lid 20 is guided to be substantially parallel to the opening surface from a state in which its main surface is tilted. Thereby, the opening of the container body 10 is closed with the lid 20 being substantially parallel to the opening surface. At this time, the upper guide rib 41b on the left side 111 can be engaged with the upper guide slit 51b on the left side 211 without interfering with the left side 211 since the lid 20 is substantially parallel to the opening surface.

As described above, when the tilt angle θ of the lid 20 is less than 20 degrees, the guide rib 41a and the guide slit 51a engage with each other, which enables the lid 20 to close the opening of the container body 10 with proper sealing.

Meanwhile, when a robot is used to attach the lid 20 or when an operator attaches the lid 20 with almost no tilting (i.e., when the tilt angle θ is 0 degrees), as illustrated in FIGS. 10A and 10B, naturally, the guide ribs 40 (41a, 41b, 42a, 42b, 43a, 43b, 44a, 44b) of the container body 10 are inserted in the guide slits 50 (51a, 51b, 52a, 52b, 53a, 53b, 54a, 54b) formed in the lid 20 without interfering with any of the left, right, upper, and lower sides 211, 212, 213, and 214.

In this manner, the guide slits 50 are designed or positioned and shaped to engage with the guide ribs 40 when the opening is closed with the lid 20 tilted at a tilt angle θ of 0 degrees or more and less than 20 degrees with respect to the opening surface.

Figure 11A:
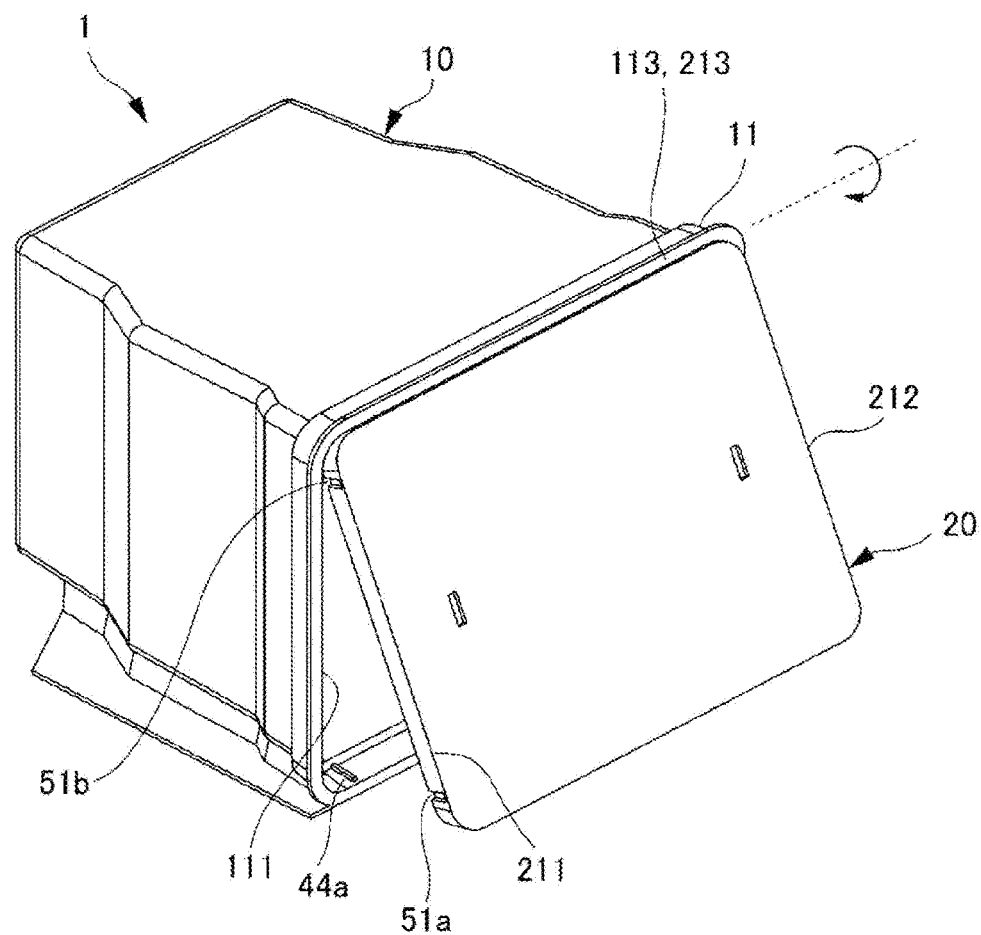
FIG. 11A is a schematic perspective view illustrating a case where the lid is attached while being tilted about the upper side of the outer periphery.
Figure 11B:
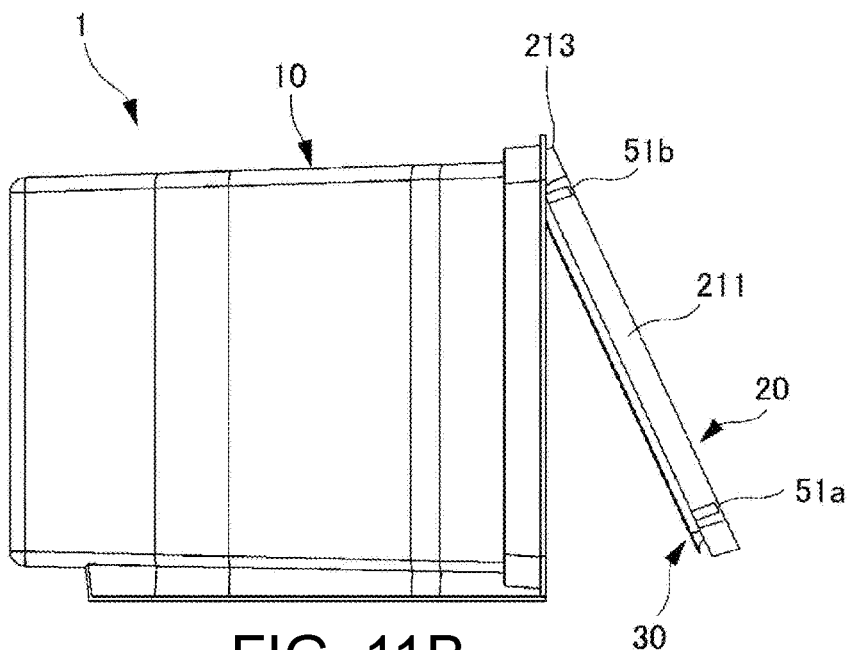
FIG. 11B is a schematic side view illustrating a case where the lid is attached while being tilted about the upper side of the outer periphery.

While an example has been described in which the opening of the container body 10 is closed with the lid 20 that is tilted (rotated) about the lower side 114 of the opening portion 11 (the lower side 214 of the lid 20), the same applies to where the lid 20 is tilted (rotated) about the upper side 113 of the opening portion 11 (the upper side 213) as illustrated in FIGS. 11A and 11B. FIGS. 11A and 11B illustrate a case where the lid 20 is attached while being tilted about the upper side 113 (213): FIG. 11A is a schematic perspective view, and FIG. 11B is a schematic side view.

In this case, the upper guide ribs 41b and 42b located respectively in the left side 111 and the right side 112 of the opening portion 11 and the upper guide slits 51b and 52b located respectively in the left side 211 and the right side 212 of the lid 20 (see also FIGS. 2 and 3) prevent the closing operation when the lid 20 is tilted 20 degrees or more.

Figure 12A:
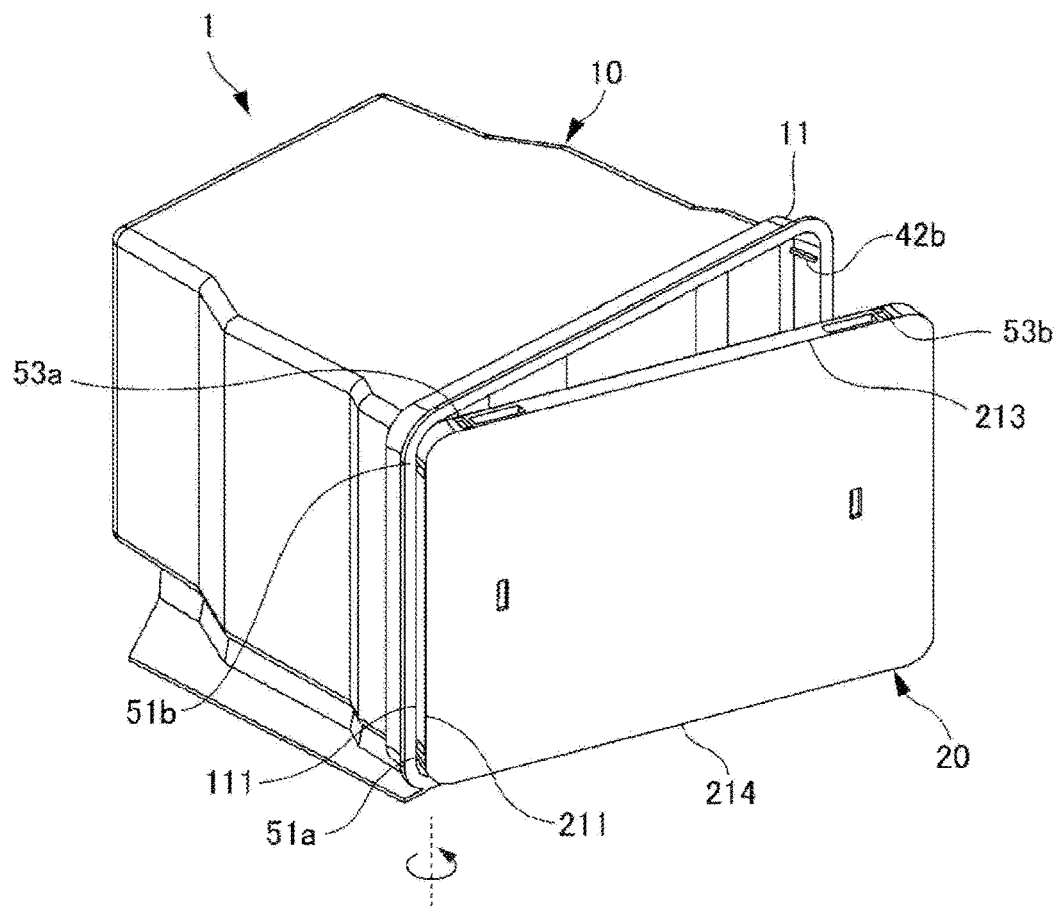
FIG. 12A is a schematic perspective view illustrating a case where the lid is attached while being tilted about the left side of the outer periphery.
Figure 12B:
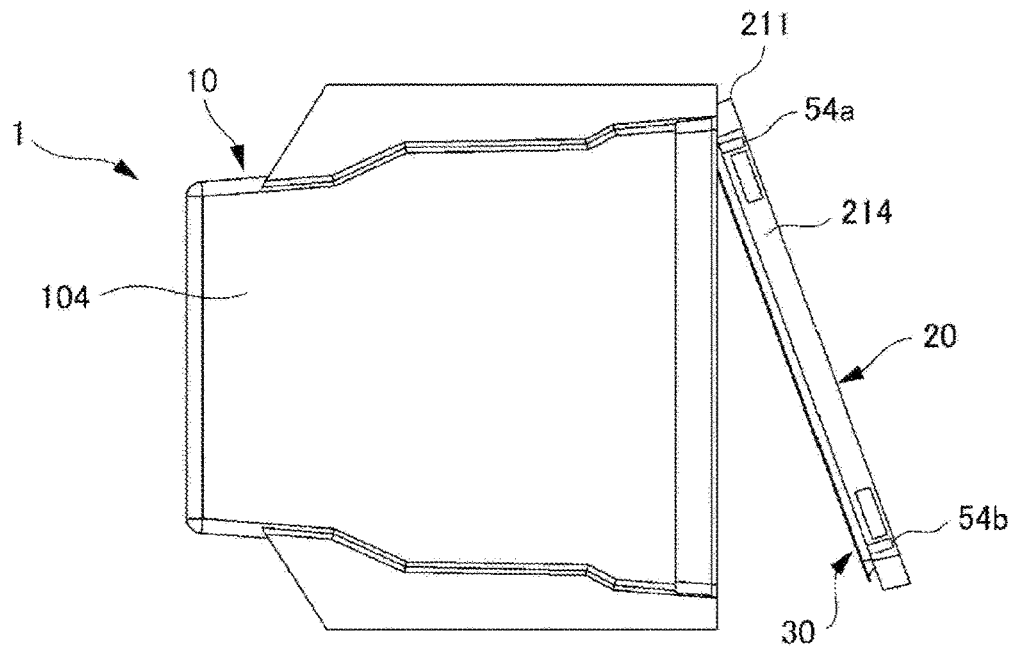
FIG. 12B is a schematic bottom view illustrating a case where the lid is attached while being tilted about the left side of the outer periphery.

The same also applies to where the lid 20 is tilted (rotated) about the left side 111 of the opening portion 11 (the left side 211) as illustrated in FIGS. 12A and 12B. FIGS. 12A and 12B illustrate a case where the lid 20 is attached while being tilted about the left side 111 (211): FIG. 12A is a schematic perspective view, and FIG. 12B is a schematic bottom view.

In this case, the left guide ribs 43a and 44a located respectively in the upper side 113 and the lower side 114 of the opening portion 11 and the left guide slits 53a and 54a located respectively in the upper side 213 and the lower side 214 of the lid 20 (see also FIGS. 2 and 3) prevent the closing operation when the lid 20 is tilted 20 degrees or more.

Although not illustrated, the same applies to where the lid 20 is tilted (rotated) about the right side 112 of the opening portion 11 (the right side 212) as well. In this case, the right guide ribs 43b and 44b located respectively in the upper side 113 and the lower side 114 of the opening portion 11 and the right guide slits 53b and 54b located respectively in the upper side 213 and the lower side 214 of the lid 20 prevent the closing operation when the lid 20 is tilted 20 degrees or more.

In this embodiment, the guide ribs 40 and the guide slits 50 are arranged in a plurality of locations so as to correspond to all of the left, right, upper, and lower sides 111, 112, 113, and 114 of the opening portion 11. However, when an operator works with both hands, the operator often inserts unlocking jigs into left and right locking mechanisms of the lid 20 to hold the lid 20 or inserts their fingers into notch openings or recesses around the locking mechanisms to grip the lid 20. In addition, the operator is likely to place the lid 20 while looking down from above such that the lower side 114 of the opening portion 11 supports the lower side 214 of the lid 20 and carries its weight. For this reason, the first-described case where the lid 20 is tilted about the lower side 114 of the opening portion 11 when attached is more common than the other cases where the lid 20 is tilted about the upper, left, or right side.

Therefore, attachment errors can be sufficiently reduced with only the guide ribs 41a and 42a and the guide slits 51a and 52a located on the lower left and right sides. Nevertheless, the more locations where the guide ribs 40 and the guide slits 50 are provided, the fewer attachment errors due to the attachment direction.

Figure 13:
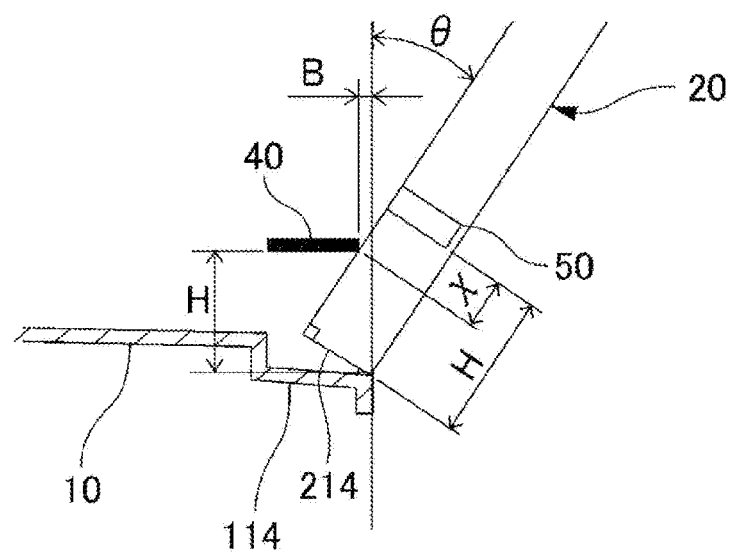
FIG. 13 is a schematic diagram illustrating the positional relationship between the guide rib and the guide slit.

Lastly, a detailed description will be given of the positional relationship between a guide rib (40) and a guide slit (50) in the substrate storage container 1 of the embodiment. FIG. 13 is a schematic diagram illustrating the positional relationship between a guide rib (40) and a guide slit (50).

The explanation below is given based on the premise that a guide rib (40) is located at a height H from the lower side 114 of the opening portion 11 and a distance B from the opening surface. It is then assumed that when tilted at a tilt angle θ, the lid 20 interferes with the guide rib (40) with a corner of the lower side 214 on the surface side contacting an opening edge on the lower side 114 of the opening portion 11. There are other possible cases in which the lower side 114 and the lower side 214 contact each other. However, the tilt angle θ is not affected when a portion other than the corner such as around the center of the lower side 214 comes into contact with the lower side 114, and the distance B, which is explained next, can be approximated to "0" when the corner of the lower side 214 comes into contact with a portion other than the opening edge such as around the center of the lower side 114. Therefore, this state can be considered as the one in which the lid 20 can be tilted to the maximum. It is also assumed that both the corners of the lower side 214 are 90 degrees.

Below is how to find the offset value X between the guide rib (40) and a guide slit (50), i.e., the position of the guide slit (50) that engages the guide rib (40) when the lid 20 is closed without being tilted, while the lid 20 is in the above state. The distance between the intersection where the lower side 214 intersects a plane parallel to and separated by the distance B from the opening surface and the opening end of the guide rib (40) is "H−B tan θ", and therefore, cos θ=(H−X)/(H−B tan θ). Thus, the offset value X can be represented as follows:

$$X = H(1-\cos\theta) + B\sin\theta \quad \text{(hereinafter "Equation 1")}$$

For example, assuming that the tilt angle θ is 20 degrees, the height H is 40 mm, and the distance B is 3 mm, the offset value X is 3.44 mm from Equation 1. The sides 211, 212, 213, and 214 of the outer periphery 21 of the lid 20 are in reality slightly shorter than their respective opposing sides 111, 112, 113, and 114 of the opening portion 11 of the container body 10. Therefore, by increasing the width of the guide slit (50) toward the lower side 214 by 3.5 mm, the guide rib (40) can be engaged with the guide slit (50) when the tilt angle θ is 20 degrees or less.

As described above, according to the embodiment, the substrate storage container 1 includes the container body 10 configured to store substrates, the lid 20 that closes the rectangular opening of the container body 10, and the annular gasket 30 that is located between the container body 10 and the lid 20. The container body 10 has the guide ribs 40 in the opening portion 11 around the opening, and the lid 20 has the guide slits 50 that are engageable with the guide ribs 40. In this configuration, the guide ribs 40 each engage a corresponding one of the guide slits 50 when the opening is closed with the lid 20, which prevents the lid 20 from tilting at a predetermined tilt angle θ or more with respect to the opening surface where the opening is formed.

Since the lid 20 is prevented from tilting at a predetermined tilt angle θ or more, the tip of the sealing piece 32 of the gasket 30 is not positioned inside the sealing surface 12. As a result, in the process of closing the container body 10 with the lid 20, the gasket 30 adheres closely to the sealing surface 12 without contacting (riding on) the inner surface of the container body 10 that intersects the sealing surface 12 of the opening portion 11, thereby reducing seal failures due to attachment errors. Thus, it is possible to improve the airtightness of the substrate storage container 1 closed with the lid 20.

In the substrate storage container 1 of the embodiment, the guide ribs 40 each engage a corresponding one of the guide slits 50 when the opening of the container body 10 is closed with the lid 20, which prevents the lid 20 from tilting at a tilt angle θ of 20 degrees or more with respect to the opening surface. This means that if the lid 20 is attached to the container body 10 so that the guide ribs 40 are engaged with the guide slits 50, the lid 20 can be prevented from tilting at a tilt angle θ of 20 degrees or more.

In the substrate storage container 1 of the embodiment, even if the lid 20 is tilted with respect to the opening surface when the opening of the container body 10 is closed with the lid 20, the guide ribs 40 engage the guide slits 50 for any tilt angle θ from 0 degrees to less than 20 degrees, while the guide ribs 40 do not engage the guide slits 50 for a tilt angle θ of 20 degrees or more. Accordingly, even if tilted, the lid 20 can be attached to the container body 10 when the tilt angle θ is less than 20 degrees with respect to the opening surface. On the other hand, the lid 20 cannot be attached to the container body 10 when tilted at a tilt angle θ of 20 degrees or more with respect to the opening surface.

In some embodiments, the container body 10 has a guide rib (41a, 41b, 42a, 42b) in at least either one of the left side 111 or the right side 112 of the opening portion 11. This suppresses seal failure when the container body 10 is closed with the lid 20 that is tilted about the upper side (113, 213) or the lower side (114, 214).

In other embodiments, the container body 10 has a guide rib (43a, 43b, 44a, 44b) in at least either one of the upper side 113 or the lower side 114 of the opening portion 11. This suppresses seal failure when the container body 10 is closed with the lid 20 that is tilted about the left side (111, 211) or the right side (112, 212).

While preferred embodiments of the invention have been described and illustrated, it is to be understood that the invention is not limited to the embodiments disclosed herein. Various changes, modifications, and alterations may be made within the scope of the invention as defined in the appended claims.

MODIFICATION

The above embodiment has been described using an example in which the container body 10 has the guide ribs 40 and the lid 20 has the guide slits 50; however, since the engagement relationship between the guide ribs 40 and the guide slits 50 is complementary, the other way around is also possible. That is, the substrate storage container 1 may be configured such that the container body 10 has the guide slits 50 and the lid 20 has the guide ribs 40.

Furthermore, the container body 10 and the lid 20 may have both the guide ribs 40 and the guide slits 50 complementarily. More specifically, for example, the container body 10 may have the guide ribs 40 on the left side 111 and the right side 112 and the guide slits 50 on the upper side 113 and the lower side 114. Similarly, the lid 20 may have the guide slits 50 on the left side 211 and the right side 212 and the guide ribs 40 on the upper side 213 and the lower side 214.

In the above embodiment, different guide ribs (41a, 42a, 41b, 42b) and different guide slits (51a, 52a, 51b, 52b) are provided for the tilt about the upper side 113 of the opening portion 11 and the tilt about the lower side 114. However, the guide ribs 40 and the guide slits 50 may be provided as common ones for both by adjusting the length of the guide ribs 40 in the closing direction (or the distance B) and the offset value X of the guide slits 50 according to Equation 1. The same applies to the tilt about the left side 111 and the tilt about the right side 112.

In the above embodiment, the guide slits 50 (51a, 52a, 51b, 52b) are formed with the same width from the insertion side where the guide ribs 40 are inserted (opening side) to the surface side of the lid 20. However, the guide slits may be tapered or stepped such that they are gradually narrowed from the insertion side, as long as the condition of the tilt angle θ remains the same.

The invention claimed is:

1. A substrate storage container, comprising:
a container body configured to store a substrate;
a lid that closes a rectangular opening of the container body; and
an annular gasket located between the container body and the lid, wherein
the container body has at least either one of a guide rib or a guide slit in an opening portion around the opening,
the lid has at least either one of a guide slit or a guide rib that is engageable with the guide rib or the guide slit of the container body, and
the guide rib and the guide slit are configured to restrict tilting of the lid with respect to an opening surface where the opening is formed when the opening is closed with the lid, wherein the guide rib is prevented from engaging the guide slit when the lid is tilted at a predetermined tilt angle or more with respect to the opening surface and is allowed to engage the guide slit when the lid is tilted less than the predetermined tilt angle.

2. The substrate storage container according to claim 1, wherein the guide rib and the guide slit engage each other when the opening is closed with the lid and prevent the lid from tilting 20 degrees or more with respect to the opening surface.

3. The substrate storage container according to claim 1, wherein in a case where the lid is tilted with respect to the opening surface when the opening is closed with the lid, the guide rib and the guide slit engage each other for any tilt angle from 0 degrees to less than 20 degrees, and the guide rib and the guide slit do not engage each other for a tilt angle of 20 degrees or more.

4. The substrate storage container according to claim 2, wherein in a case where the lid is tilted with respect to the opening surface when the opening is closed with the lid, the guide rib and the guide slit engage each other for any tilt angle from 0 degrees to less than 20 degrees, and the guide rib and the guide slit do not engage each other for a tilt angle of 20 degrees or more.

* * * * *